(12) United States Patent
Ikeda et al.

(10) Patent No.: US 8,487,308 B2
(45) Date of Patent: Jul. 16, 2013

(54) THIN FILM TRANSISTOR AND IMAGE DISPLAY UNIT

(75) Inventors: Noriaki Ikeda, Tokyo (JP); Kodai Murata, Tokyo (JP); Manabu Ito, Tokyo (JP); Chihiro Miyazaki, Tokyo (JP)

(73) Assignee: Toppan Printing Co., Ltd. (JP)

( * ) Notice: Subject to any disclaimer, the term of this patent is extended or adjusted under 35 U.S.C. 154(b) by 521 days.

(21) Appl. No.: 12/753,781

(22) Filed: Apr. 2, 2010

(65) Prior Publication Data

US 2010/0258805 A1    Oct. 14, 2010

(30) Foreign Application Priority Data

Apr. 10, 2009  (JP) ................. 2009-096113
Jan. 7, 2010   (JP) ................. 2010-001816

(51) Int. Cl.
*H01L 23/04*   (2006.01)
*H01L 31/036*  (2006.01)
*H01L 27/01*   (2006.01)
*H01L 27/12*   (2006.01)
*H01L 31/0376* (2006.01)

(52) U.S. Cl.
USPC ............... 257/59; 257/57; 257/72; 257/347; 257/350

(58) Field of Classification Search
USPC ............ 257/59, 57, 72, 71, 40, 296, 535, 257/368, 306, 347, 350, 202, 351, 443
See application file for complete search history.

(56) References Cited

U.S. PATENT DOCUMENTS 7,465,593 B2 * 12/2008 Yamazaki et al. ............ 438/26
2005/0087769 A1 * 4/2005 Yamazaki et al. ............ 257/202

FOREIGN PATENT DOCUMENTS

| JP | 2002-353463 | 12/2002 |
| JP | 2008-205469 | 9/2008 |
| JP | 2009-099953 | 5/2009 |

\* cited by examiner

*Primary Examiner* — Chuong A. Luu
(74) *Attorney, Agent, or Firm* — Squire Sanders (US) LLP

(57) ABSTRACT

One embodiment of the present invention is a thin film transistor having a substrate, a gate electrode formed on the substrate, a gate insulating film, a semiconductor layer formed on the gate insulating film, a protective film formed on the semiconductor layer and the gate insulating film and having first and second opening sections which are separately and directly formed on the semiconductor layer, a source electrode formed on the protective film and electrically connected to the semiconductor layer at the first opening section of the protective film, and a drain electrode formed on the protective film and electrically connected to the semiconductor layer at the second opening section of the protective film.

13 Claims, 8 Drawing Sheets

THIN FILM TRANSISTOR AND IMAGE DISPLAY UNIT

CROSS REFERENCE TO RELATED APPLICATION

This application is based on and claims the benefit of priority from the Japanese Patent Application number 2009-096113, filed on Apr. 10, 2009 and the Japanese Patent Application number 2010-001816, filed on Jan. 7, 2010; the entire contents of which are incorporated herein by reference.

BACKGROUND OF THE INVENTION

Field of the Invention

The present invention relates to a thin film transistor and an image display unit of an active matrix type.

In recent years, a liquid crystal display unit, an electrophoresis display unit and an organic electroluminescence display unit of an active matrix type in which a thin film transistor array is employed are widely utilized as an image display unit.

As an existing display unit of an active matrix type, a display unit in which a non-single crystal silicon is used as a semiconductor material for a thin film transistor array is mainly utilized. (Patent Document 1)

Here, FIG. 5 is a schematic cross-sectional diagram of a thin film transistor 50 used for an existing image display unit. FIG. 6 is a schematic cross-sectional diagram of an existing image display unit 40 of an active matrix type using a thin film transistor 50. The thin film transistor 50 shown in FIG. 5 will be explained below.

As shown in FIG. 5, the existing thin film transistor 50 has a substrate 31, a gate electrode 32 and a capacitor electrode 33 separately arranged on the substrate 31, a gate insulating layer 34 formed so as to cover entire surfaces of the gate electrode 32 and the capacitor electrode 33, a semiconductor layer 35 formed on the gate insulating layer 34, and a source electrode 38 and a drain electrode 39 separately formed and electrically connected to the semiconductor layer 35. Further, the thin film transistor also has a protective film 36 in some cases.

In the thin film transistor 50 having an existing structure, the gate insulating layer 34 isolates the source electrode 38 from the gate electrode 32. However, an electrical field may easily gather at an edge of the gate electrode 32. Further, a tapered part of the edge of the gate electrode tends to be poorly covered by the gate insulating layer. Thus, a leak current may easily occur between the gate electrode 32 and the source electrode 38.

The purpose of the present invention is to provide a thin film transistor and an image display unit which can uniformly and steadily operate in which a leak current between a gate electrode and a source electrode is reduced by improving insulating properties between the gate electrode and the source electrode.

Patent Document 1: JP-A 2002-353463

SUMMARY OF THE INVENTION

One embodiment of the present invention is a thin film transistor having a substrate, a gate electrode formed on the substrate, a gate insulating film, a semiconductor layer formed on the gate insulating film, a protective film formed on the semiconductor layer and the gate insulating film and having first and second opening sections which are separately and directly formed on the semiconductor layer, a source electrode formed on the protective film and electrically connected to the semiconductor layer at the first opening section of the protective film, and a drain electrode formed on the protective film and electrically connected to the semiconductor layer at the second opening section of the protective film.

1 is a substrate,
2 is a gate electrode,
3 is a capacitor electrode,
4 is a gate insulating film,
5 is a semiconductor layer.
6 is a protective film,
6a is an under protective film,
6b is an upper protective film,
7a is a first opening section of a protective film,
7b is a second opening section of a protective film,
7c is a third opening section of a protective film,
8 is a source electrode,
9 is a drain electrode,
10 is an inter-layer insulating film,
11 is a pixel electrode,
12 is a display element,
13 is a counter electrode,
14 is a counter substrate,
20 is an image display unit,
30 is a thin film transistor,
31 is a substrate,
32 is a gate electrode,
33 is a capacitor electrode,
34 is a gate insulating layer,
35 is a semiconductor layer,
36 is a protective film,
38 is a source electrode,
39 is a drain electrode,
41 is inter-layer insulating film,
42 is a pixel electrode,
43 is a display element, 44 is a common electrode
45 is a front substrate,
40 is an image display unit,
50 is a thin film transistor.

DETAILED DESCRIPTION OF THE INVENTION

The embodiments of the present invention will be explained below referring the diagrams. The same constituent elements have the same identical signs in the embodiments and therefore duplicative explanations between the embodiments are omitted.

Figure 1:
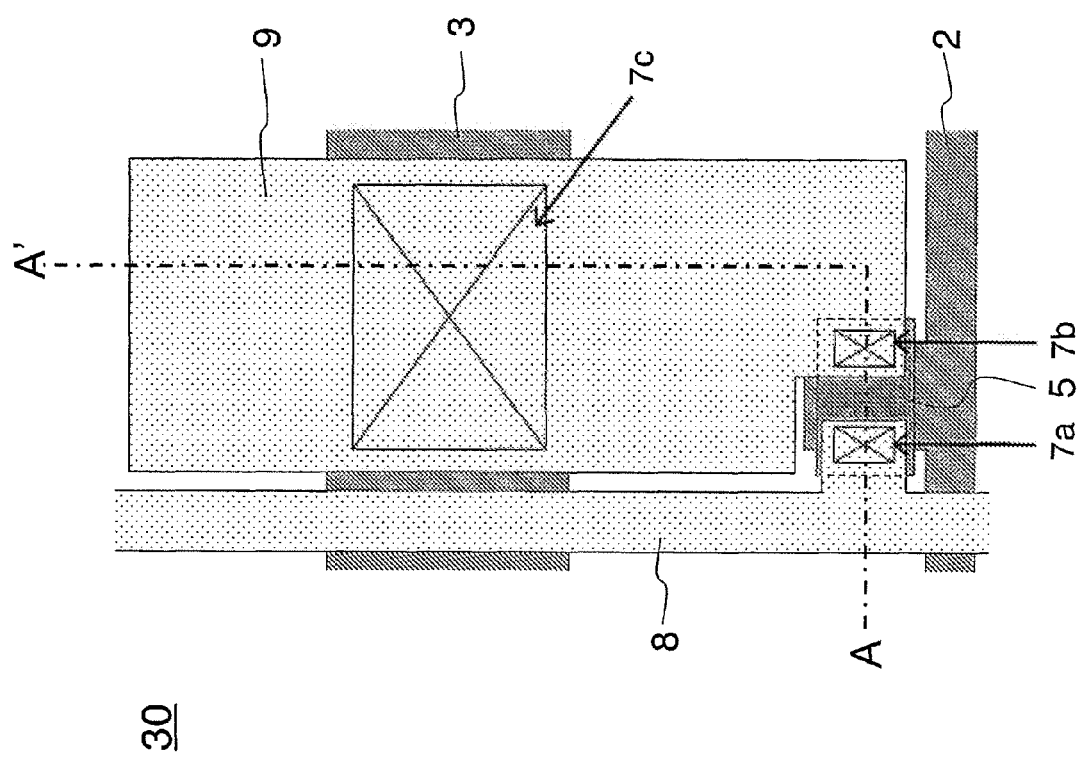
FIG. 1 is a schematic plane view showing approximately one pixel of a thin film transistor of an embodiment of the present invention. A substrate 1, a gate insulating film 4 and a protective film 6 are not illustrated in this view.
Figure 2:
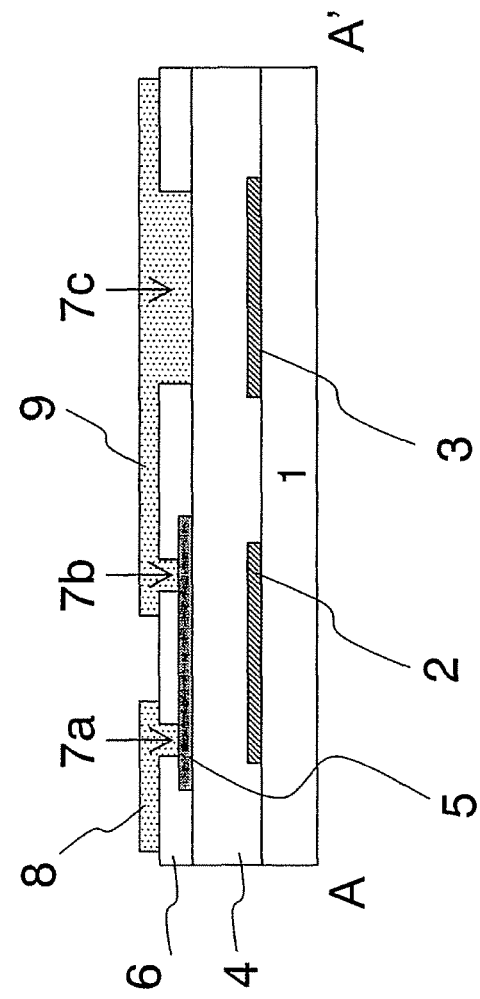
FIG. 2 is a schematic cross-sectional diagram showing approximately one pixel of a thin film transistor of an embodiment of the present invention. A-A' in this diagram corresponds to that of FIG. 1.
Figure 3:
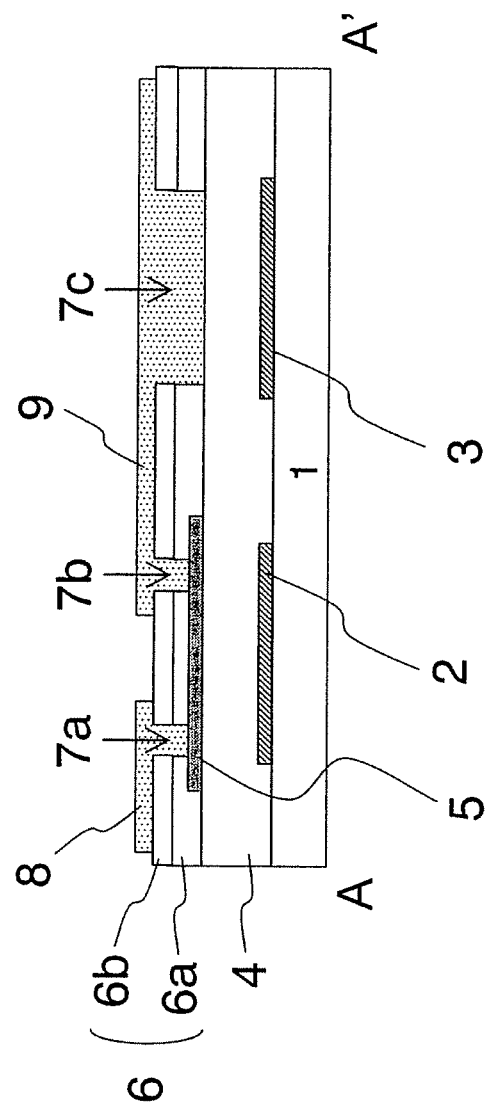
FIG. 3 is a schematic cross-sectional diagram showing approximately one pixel of a thin film transistor of an embodiment of the present invention. A-A' in this diagram corresponds to that of FIG. 1.

FIG. 1 is a schematic plane view showing approximately one pixel of a thin film transistor 30 of an embodiment of the present invention. FIGS. 2 and 3 are schematic cross-sectional diagrams showing approximately one pixel of a thin film transistor of an embodiment of the present invention. A-A' in FIG. 1 corresponds to those of FIGS. 2 and 3. The thin film transistor 30 of the present invention has a gate electrode 2 formed on a substrate 1, a gate insulating film 4 formed on the gate electrode 2 so as to cover the gate electrode 2, a semiconductor layer 5 formed on the gate insulating film 4, and a source electrode 8 and a drain electrode 9 connected to the semiconductor layer. In addition, a protective film 6 is formed on the semiconductor layer. Furthermore, the source electrode and the drain electrode are connected to the semiconductor layer through a first opening section 7a and a second opening section 7b of the protective film which are separately and directly arranged on the semiconductor layer. The protective film located under a drain electrode 9 has a third opening section 7c. The drain electrode 9 is formed on the capacitor electrode 3 sandwiching the gate insulating film 4 therebetween.

Respective constituents of the present invention will be explained in detail below in line with a method for manufacturing an image display unit.

As a material for the substrate 1 in the embodiment of the present invention, in particular, polymethylmethacrylate, polyacrylates, polycarbonate, polystyrene, poly(ethylenesulfide), polyethersulfone, polyolefin, polyethylene terephthalate, polyethylene naphthalate, cycloolefin polymers, triacetylcellulose, a polyvinyl fluoride film, an ethylene-tetrafluoroethylene copolymer resin, weather-resistant polyethylene terephthalate, weather-resistant polypropylene, a fiberglass reinforced acrylate resin film, fiberglass reinforced polycarbonate, transparent polyimide, a fluorine series resin, a cyclic polyolefin series resin, a glass, a quartz or the like can be used. However, a usable material is not limited to these in the present invention. The above mentioned material can be used alone or two or more materials can be stacked as a composite substrate 1.

When the substrate 1 in the embodiment of the present invention is an organic film, a transparent gas barrier layer (not illustrated) is preferably formed in order to improve durability of the thin film transistor. As a material for the gas barrier film, aluminum oxide ($Al_2O_3$), silicon oxide ($SiO_2$), silicon nitride (SiN), silicon oxynitride (SiON), silicon Carbide (SiC), diamond-like carbon or the like can be used. However, a usable material is not limited to these. In addition, the gas barrier layer can be used by stacking two or more layers of the materials. The gas barrier layer may be formed on only one side or both sides of the substrate formed of an organic film. The gas barrier layer can be formed by a vacuum deposition method, an ion plating method, a sputtering method, a laser abrasion method, a plasma CVD (Chemical Vapor Deposition) method, a hot-wire CVD method, a sol gel method or the like. However, a usable method is not limited to these.

First, wirings of the gate electrode 2 and the capacitor electrode 3 are respectively formed on the substrate 1. The electrode part and the wiring part are not required to completely separate from each other. Particularly, in the present invention, a combination of the wiring part and the electrode part is called an electrode as a constituent element of the thin film transistor. In addition, when there is no necessity to distinguish the wiring from the electrode, gate, source, drain and capacitor are used to describe the constituent combining the electrode and the wiring.

In the thin film transistor 30 of the present invention shown in FIG. 1, the combinations of the gate electrode-the gate wiring and the capacitor electrode-the capacitor wiring are formed in stripe shapes. Therefore, the thin film transistor array can be arranged on the lines of the gate and the capacitor.

As a material for the respective electrodes (the gate electrode 2, the source electrode 8, the drain electrode 9, the capacitor electrode 3 and a pixel electrode 11) and the wirings connected to the respective electrodes, an oxide material such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), zinc tin oxide ($Zn_2SnO_4$) or Indium zinc oxide (In—Zn—O) can be used. In addition to thus, an oxide material in which an impurity is doped in order to improve properties such as electrical properties, optical properties and chemical resistance properties can also be preferably used. For example, a material consisted of indium oxide doped with tin (Sn), molybdenum (Mo) or titanium (Ti), a material consisted of tin oxide doped with antimony (Sb) or fluorine (F), and a material consisted of zinc oxide doped with indium, aluminum or gallium (Ga) or the like can be used. In particular, indium tin oxide consisted of indium oxide doped with tin (Sn) is preferably used among the above mentioned materials in terms of its excellent transparency and high resistivity.

Moreover, a stacked layer having the above mentioned conductive oxide material and a metal thin film such as gold (Au), silver (Ag), copper (Cu), cobalt (Co), tantalum (Ta), molybdenum (Mo), chrome (Cr), aluminum (Al), nickelic (Ni), tungsten (W), platinum (Pt) or titanium (Ti) can also be used. In this case, in order to prevent a metal material from oxidation and time degradation, particularly, a three-layer structure in which a conductive oxide thin film/a metal thin film/a conductive oxide thin film are stacked in this order can be preferably used. The metal thin film layer is preferably as thin as possible in order that visibility of the display unit is not interrupted by light reflection or light absorption of the metal thin film layer. In particular, the thickness of the metal thin film layer is preferably equal to more than 1 nm and equal or less than 20 nm.

Furthermore, an oxide conductive material such as PEDOT (poly(3,4-ethylenedioxythiophene)) or the like can also be preferably used.

When transparency is not required, a metal material having a light blocking effect can be used. In particular, the above described metal such as gold (Au), silver (Ag), copper (Cu), cobalt (Co), tantalum (Ta), molybdenum (Mo), chrome (Cr), aluminum (Al), nickelic (Ni), tungsten (W), platinum (Pt) or titanium (Ti) can be used.

In addition, a material having a light blocking effect can be used only for one part of the electrodes and of the wirings. For example, in the image display unit of the present invention, when the gate and the source are formed in an area other than a display area such as a black matrix area, the gate and the source can be formed of the metal material having the light blocking effect.

The respective electrodes and the respective wirings may be formed of the same material or different materials and may have the same stacked structure or different stacked structures. However, the gate-the capacitor, and the source-the drain are preferably formed of the same material or preferably have the same stacked structure in order to reduce the number of manufacturing processes.

The respective electrodes and wirings can be formed by a vacuum deposition method, an ion plating method, a sputtering method, a laser abrasion method, a plasma CVD method, a photo CVD method, a hot-wire CVD method, a screen printing method, a relief printing method, an ink jet method or the like. However, a usable method is not limited to these and heretofore known general methods can be used. Patterning can be carried out, for example, by forming the protective film on a pattern formation area by a photolithographic method and by removing unnecessary parts by etching. However, a usable method is also not limited to there and heretofore known general patterning methods can be used.

Next, the gate insulating layer 4 is formed so as to cover the gate electrode. The gate insulating layer 4 can be formed on the entire surface of the substrate. As a material for the gate insulating layer 4 of the embodiment of the present invention, an inorganic material such as silicon oxide, silicon nitride, silicon oxynitride, aluminum oxide, tantalum oxide, yttrium oxide, hafnium oxide, hafnium alminate, zirconium oxide or titanium oxide, polyacrylate, such as PMMA (polymethylmethacrylate) or the like, PVA (polyvinyl alcohol), PS (polystyrene), transparent polyimide, polyester, epoxy, polyvinylphenol, polyvinyl alcohol or the like can be used. However, a usable material is not limited to these. A resistivity of an insulating material is preferably equal to or more than $10^{11}$ $\Omega$cm, more preferably equal to or more than $10^{14}$ $\Omega$cm in order to control a gate leak current.

The gate insulating film 4 can be arbitrarily formed by a dry film-formation method such as a vacuum deposition method, an ion plating method, a sputtering method, a laser abrasion method, a plasma CVD method, a photo CVD method, or a hot-wire CVD method or a wet film-formation method such as a spin coating method, a dip coating method or a screen printing method or the like depending on a material for the gate insulating film 4. The gate insulating film 4 can be a single layer or a multi-layer in which two or more layers are stacked. In addition, the gate insulating film 4 may be a layer which has a composition sloping toward growth direction of the film.

Next, the semiconductor layer 5 is formed on the insulating film 4 where the gate electrode 2 is formed directly underneath, as shown in FIGS. 1-3.

As the semiconductor layer 5 in the embodiment of the present invention, non-single crystal silicon, an organic compound or metal oxide can be used.

As the semiconductor layer 5 in the embodiment of the present invention, an oxide semiconductor material which has metal oxide as a main component can be used. As the oxide semiconductor material, zinc oxide (ZnO), indium oxide (InO), indium zinc oxide (In—Zn—O), tin oxide (SnO), tungsten oxide (WO), indium gallium zinc oxide (In—Ga—Zn—O) or the like which includes one or more elements among zinc (Zn), indium (In), tin (Sn), tungsten (W), magnesium (Mg) and gallium can be used.

A Structure of these materials may be single crystal, multicrystal, micro crystal, mixed crystal of crystal/amorphous, nanocrystal scattering amorphous or amorphous.

Furthermore, when there is no necessity for the semiconductor layer to be transparent, as other inorganic materials which can be used, a silicon semiconductor such as hydrogenated amorphous silicon, microcrystal silicon, multicrystal silicon or single crystal silicon can be exemplified.

The inorganic material such as the above described oxide semiconductor or the silicon semiconductor can be formed by a CVD method, a sputtering method, a pulsed laser deposition method, a vacuum deposition method or a sol gel method. As a CVD method, a hot wire CVD method and a plasma CVD method can be exemplified. As a sputtering method, a RF magnetron sputtering method and a DC sputtering method can be exemplified. As a vacuum deposition method, a heating deposition, an electron beam deposition and an ion plating method can be exemplified. However, a usable method is not limited to these.

In addition, as the semiconductor layer formed of an organic material, a low molecule organic semiconductor such as tetracene, pentacene, oligothiophene derivatives, phthalocyanine type or perylene derivative or a high molecule organic semiconductor such as polyfluorene, polyphenylenevinylene or polytriallylamine can be exemplified. However, a usable material is not limited to these. These materials can be formed and patterned by each printing method such as a relief printing method, an off-set printing method, a screen printing method or an ink-jet method. Further, a thickness of the semiconductor layer 5 is preferably equal to or more than 20 nm.

Next, the protective film 6 is formed as shown in FIGS. 2 and 3. The protective film 6 is formed so as to at least cover the semiconductor layer 5 in order to protect the semiconductor layer 5 at the time of patterning the source electrode 8 and the drain electrode 9. The respective electrodes and the semiconductor layer 5 are in touch with one another only at opening sections 7a and 7b. Further, the protective film 6 is formed on the entire surface of the substrate 1 and has an opening section only at a predetermined part such as an opening section 7c. Therefore, sealing properties can be improved.

In other words, since the protective film 6 in the embodiment of the present invention is formed so as to at least cover the semiconductor layer 5, the semiconductor layer 5 can be protected from influence of the outside. In particular, the protective film 6 is preferably formed on the entire surface of a pixel area and has opening sections only at predetermined parts in order to improve sealing properties. In addition, insulating properties can be improved by forming a thickness of the insulating film so as to be substantially thick between the gate electrode and the source electrode/the drain electrode. Thus, a leak current and a parasitic capacity that may occur between the gate electrode and the source electrode/the drain electrode can be reduced. Further, when a capacitor electrode 3 is arranged, a third opening section 7c may be formed between the capacitor electrode 3 and the drain electrode 9 in order not to damage an electrostatic capacity.

A shape of the protective film 6 is preferably formed such that the edge parts of opening sections are in a forward tapered shape. By forming the edge parts in the forward tapered shape, the edge parts of the opening sections of the protective film 6 have a blunt angle. Hence, the source electrode and the drain electrode can be formed on uneven parts of the edge parts of the opening sections without disconnecting even by a film-formation method having a high linearity.

In order to form the opening sections of the protective film in the forward tapered shape, when the protective film is formed of a resin compound, a material having a thermal reflow property or the like can be used and when the protective film is formed of a photosensitive material, a proximity exposure or the like can be used. By using these materials, the forward tapered shape can be easily formed. In addition, when the protective film 6 is formed of an inorganic material, the tapered shape can be controlled by controlling etching conditions by a reactive ion etching method (RIE) or the like.

As a material for the protective film 6 in the embodiment of the present invention, an inorganic insulating material such as silicon oxide, silicon nitride, silicon oxynitride, aluminum oxide, tantalum oxide, yttrium oxide, hafnium oxide, hafnium alminate, zirconium oxide or titanium oxide, polyacrylate such as PMMA (polymethylmethacrylate), or an organic insulating material such as PVA (polyvinyl alcohol), PS (polystyrene), transparent polyimide, polyester, epoxy or polyvinylphenol can be used. However, a usable material is not limited to these. For example, a material in which an inorganic insulating material is mixed with an organic insulating material can be used. A resistivity of the protective film 6 is preferably equal to or more than $10^{11}$ Ωcm, more preferably equal to or more than $10^{14}$ Ωcm in order not to electrically effect the semiconductor layer of the thin film transistor of the present invention.

The protective film 6 can be arbitrarily formed by a dry film-formation method such as a vacuum deposition method, an ion plating method, a sputtering method, a laser abrasion method, a plasma CVD method, a photo CVD method or a hot-wire CVD method, or a wet film-formation method such as a spin-coating method, a dip-coating method or a screen printing method depending on its material. The protective film 6 may be formed by o manufacturing method or multiple manufacturing methods and may have a multilayer structure in which two or more layers are stacked as described below.

Since the protective film 6 is formed before the source electrode and the drain electrode, the protective film works as an etching stopper. Hence, the source electrode 8 and the drain electrode 9 can be formed without damaging a channel part of the semiconductor layer 5. Further, before the source electrode and the drain electrode are formed, a surface processing can be performed on an exposed area of the semiconductor layer 6. The surface processing is carried out after the opening sections of the protective film 6 are formed and the connection parts of the semiconductor layer and the source electrode/the drain electrode are exposed. Therefore, the surface processing can be performed only on connection parts. For example, when the semiconductor layer is a silicon semiconductor or the like formed of an inorganic material, a contact resistance of the semiconductor layer 5 and the source electrode 8/the drain electrode 9 can be reduced by injecting an ion into a part where the electrodes make contacts. In addition, when the semiconductor layer 5 is formed of a metal oxide material, conductive properties of the connection parts where the exposed semiconductor layer 5 and the source electrode 8/the drain electrode 9 make contacts can be improved by irradiating only the connection parts with plasma using a gas such as Ar, He or hydrogen while the channel parts of the semiconductor layer 5 are protected.

Therefore, the contact resistance of the semiconductor layer 5 and the source electrode 8/the drain electrode 9 can be reduced. Particularly, when the protective film is patterned using plasma such as RIE, the surface processing can be performed without increasing the manufacturing process, because the plasma irradiation can be continuously carried out on the connection parts of the semiconductor layer 5.

Furthermore, as shown in FIG. 3, the protective film 6 may have a multilayer structure. In this case, an under protective film 6a can be easily patterned by using an upper protective film 6b as an etching stopper or a resist. In other words, an organic insulating material used as the etching stopper or the resist for patterning the under protective film 6a can be used for the upper protective film 6b as the material is not removed. In particular, first, the under protective film 6a is formed on the entire surface of the substrate. Then, the upper protective film 6b is formed and patterned thereon. When the upper protective film 6b is patterned, degradation in the semiconductor layer caused by a developer used in a photolithographic process or etching can be prevented because of the under protective film 6a. Next, a part of the under protective film 6a which is not covered with the upper protective film 6b is removed using the protective film 6b as an etching stopper or a resist. In this case, an organic insulating material which may be easily patterned is preferably used for the upper protective film 6b. For the under protective film 6a, an inorganic insulating material having an excellent barrier property and a excellent durability, in particular metal oxide (including oxynitride) or metal nitride, can be preferably used.

In addition, in particular, when metal oxide is used for the semiconductor layer 5, semiconductor properties are significantly influenced by a composition of the protective film which covers the surface of the semiconductor layer. However, by separately forming the upper protective film 615 and the under protective film 6a which is in touch with the semiconductor layer 5, a forming method and a material for the upper protective film 6b become more flexible and further, the properties of the semiconductor layer can be maintained and improved because of the under protective film 6a. As the under protective film 6a, a metal nitride insulating material having excellent barrier properties such as silicon nitride or silicon oxynitride or a metal oxide insulating material having an effect of doping a carrier into the semiconductor layer 5 such as silicon oxide, aluminum oxide, tantalum oxide, yttrium oxide, hafnium oxide or silicon oxynitride can be exemplified. When the metal oxide insulating material is used for the under protective film 6a which is in touch with the semiconductor layer 5, the TFT properties can be improved by changing a carrier concentration of the semiconductor layer, as an oxygen concentration in the protective film is controlled by controlling oxygen partial pressure at the time of forming the film.

The protective film having a multilayer structure can be easily formed by the above described process. As a matter of course, in this case, the protective film 6b can further be a multilayer and have a multi-layer structure. For example, when the metal oxide semiconductor is used, the metal oxide insulating material capable of controlling the semiconductor properties may be used for the layer having contact with the semiconductor layer 5 and the metal nitride insulating material having excellent barrier properties may be used for the layer thereon.

Next, the source and the drain are formed. First, a film of a conductive material of a wiring material and an electrode material is formed on the entire surface of the substrate and covers the substrate including the protective film 6. Then, the source electrode and the drain electrode are patterned so as to respectively cover the exposed part of the semiconductor layer 5 at opening sections 7a and 7b of the protective film 6 and be electrically connected to the semiconductor layer 5. A manufacturing method and a material for the source and the drain are as described above. In addition, the drain electrode is also formed on the opening section 7c of the protective film which is directly arranged on the capacitor electrode.

Figure 4:
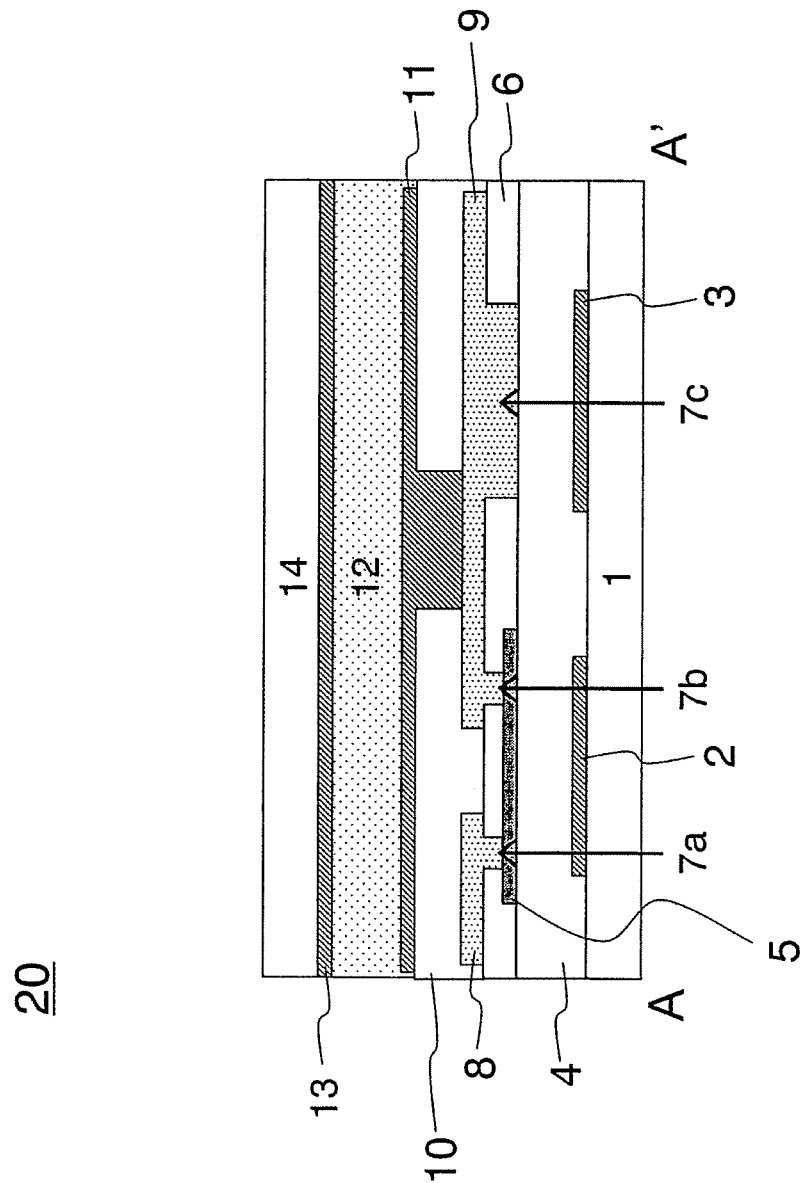
FIG. 4 is a schematic cross-sectional diagram showing approximately one pixel of an image display unit of an embodiment of the present invention.
Figure 5:
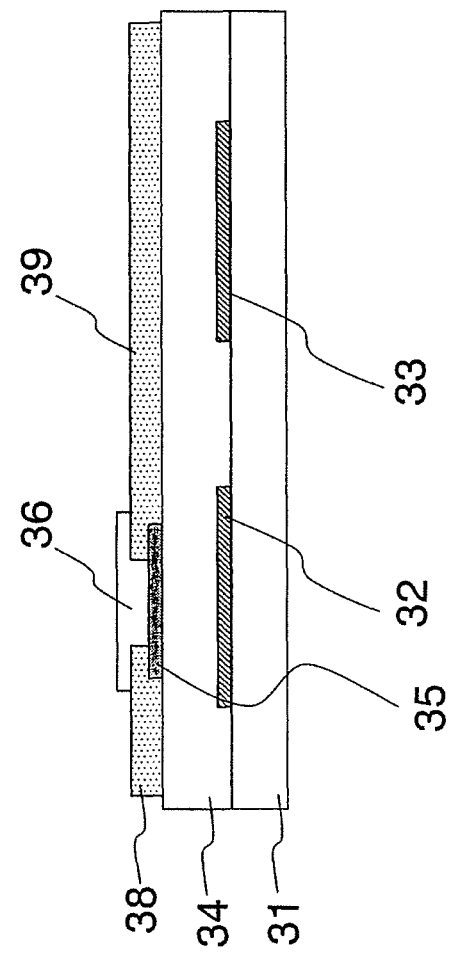
FIG. 5 is a schematic cross-sectional diagram showing approximately one pixel of a thin film transistor which has an existing structure of a related art of the present invention.

An image display unit 20 having the thin film transistor 30 of the embodiment of the present invention will be explained in reference to FIG. 4. FIG. 4 is a schematic cross-sectional diagram showing approximately one pixel of an image display unit of an embodiment of the present invention. The image display unit 20 of the present invention has an inter-layer insulating film 10 and a pixel electrode 11 on the thin film transistor shown in FIGS. 2 and 3. In addition, the image display unit has a structure where an display element 12 is sandwiched between the pixel electrode and a counter substrate 14 having a counter electrode 13.

The drain electrode 9 and the pixel electrode are connected sandwiching the inter-layer insulating film 10 therebetween. The image display unit having the thin film transistor 30 of the present invention is not limited to the structure of FIG. 4. For example, an image display unit may have a structure in which a drain electrode also serves as a pixel electrode and a display element is sandwiched between the drain electrode and a counter electrode without an inter-layer insulating film.

The inter-layer insulating film 10 which isolates the source electrode 8 and the pixel electrode 11 is formed on the substrate on which the source and the drain are formed such that the image display unit having the thin film transistor of the embodiment of the present invention can be manufactured. As a material for the inter-layer insulating film 10 of the embodiment of the present invention, an inorganic material such as silicon oxide, silicon nitride, silicon oxynitride, aluminum oxide, tantalum oxide, yttrium oxide, hafnium oxide, hafnium alminate, zirconium oxide or titanium oxide, polyacrylate such as PMMA (polymethylmethacrylate) or the like, PVA (polyvinyl alcohol), PS (polystyrene), transparent polyimide, polyester, epoxy, polyvinylphenol or the like can be used. However, a usable material is not limited to these. A resistivity of the inter-layer insulating film 10 is preferably equal to or more than $10^{11}$ Ωcm, more preferably equal to or more than $10^{14}$ Ωcm such that the inter-layer insulating film 10 can isolate the source electrode 8 and the pixel electrode 11. The inter-layer insulating film can be formed of the same material used for the gate insulating film 4 or of a different material. The inter-layer insulating film may be a layer which has a composition sloping toward growth direction of the film. In addition, the inter-layer insulating film can be a multilayer in which two or more layers are stacked.

The inter-layer insulating film 10 can be arbitrarily formed by a dry film-formation method such as a vacuum deposition method, an ion plating method, a sputtering method, a laser abrasion method, a plasma CVD method, a photo CVD method, a hot-wire CVD method or a wet film-formation method such as a spin-coating method, a dip-coating method or a screen printing method depending on its material.

The inter-layer insulating film 10 has an opening section on the drain electrode 9 and the drain electrode 9 can be connected to the pixel electrode 11. The opening section can be formed by a heretofore known method such as a photolithography method or etching after or at the time of forming the inter-layer insulating film 10. The pixel electrode can also be formed on the source electrode because of the inter-layer insulating film 10. Therefore, an aperture ratio of the image display unit can be improved.

Next, the pixel electrode 11 is formed by forming a film of a conductive material on the inter-layer insulating film 10 and patterning the film in the predetermined pixel shape. Conduction between the drain electrode and the pixel electrode can be obtained by forming the pixel electrode on the opening section of the inter-layer insulating film where the drain electrode is exposed as shown in FIG. 4.

Furthermore, the image display unit of the present invention shown in FIG. 4 can be obtained by forming the display element 12, the counter electrode 13 and the counter substrate 14 in this order on the pixel electrode 11. As the display element, an electrophoresis display medium (electronic paper), a liquid crystal display medium, an organic electroluminescence, an inorganic electroluminescence or the like can be exemplified. A method for staking the display element 12, the counter electrode 13 and the counter substrate 14 can be arbitrarily selected according to a kind of the display element. For example, a method in which a laminated body of the counter substrate 14, the counter electrode 13 and the display element 12 is adhered to the pixel electrode, a method in which the display element, the counter electrode and the counter substrate are stacked in this order on the pixel electrode or the like can be used.

According to the present invention, the insulating properties between the gate electrode and the source electrode, and the capacitor electrode and the source electrode are improved and a leak current between the gate electrode and the source electrode, and the capacitor electrode and the source electrode is reduced. Then, the present invention can provide the thin film transistor and the image display unit which can steadily operate.

Example

The present inventors manufactured an image display unit using In—Ga—Zn—O series oxide as a material for a semiconductor layer 5 and silicon oxynitride (SiON) as a protective film 6. Then, the present inventors observed a leak current between a gate electrode 2 and a source electrode 8 which sandwich a gate insulating film 4.

The image display unit 20 shown in FIG. 4 was manufactured as an example of the present invention.

Alkali-free glass 1737 manufactured by Corning was used as a substrate 1. A film of ITO was formed so as to have a thickness of 100 nm on the substrate 1 by a DC magnetron sputtering method and patterned in a predetermined shape by a photolithography method. Particularly, after a photosensitive positive type photoresist was applied to the ITO film, the resist pattern of the predetermined shape was formed by exposing and developing the film with an alkaline developer. Further, etching was performed on the film with an ITO etchant and an unnecessary part of ITO was solved. Thereafter, the photoresist was removed using a resist abrasion liquid and the gate electrode 2 and the capacitor electrode 3 are formed in the predetermined shape. (This kind of patterning method is hereinafter omitted as a photolithography method)

Next, a gate insulating film 4 was formed by forming a film of silicon oxynitride (SiON) with a thickness of 300 nm by a RF magnetron sputtering method on the entire surface of the substrate on which the gate electrode 2 and the capacitor electrode 3 were formed.

Next, a film of indium gallium zinc oxide (In—Ga—Zn—O) was formed so as to have a thickness of 40 nm by a RF magnetron sputtering method on the gate insulating film 4. Then, a semiconductor layer 5 was formed by patterning the film by the photolithography method which was utilized for forming the gate electrode 2 and the capacitor electrode 3.

A film of SiON with a thickness of 100 nm was formed as a protective film 6 on the semiconductor layer 5 by a RF magnetron sputtering method. After a photosensitive positive type resist was applied thereon, the film was exposed and developed. Then, the SiON film was etched by a reactive ion etching method using carbon tetrafluoride. Thereafter, the resist pattern was removed using an abrasion liquid. Thus, opening sections 7a and 7b which serve as connection parts of the semiconductor layer 5 and a source electrode 8/a drain electrode 9 are formed. In addition, an opening section 7c was formed without damaging an electrostatic capacity between the capacitor electrode 3 and the drain electrode 9.

Next, a film of ITO was formed so as to have a thickness of 100 nm by a DC magnetron sputtering method. The source electrode 8 and the drain electrode 9 were formed by patterning the film in a predetermined shape by the photolithography method.

Next, a film of a photosensitive acrylic resin with a thickness of 3 μm was applied and exposed. Then, an inter-layer insulating film 10 was formed by developing and burning the film.

A film of ITO with a thickness of 100 nm was formed thereon by a DC magnetron sputtering method. Thus, a pixel electrode 11 was formed by patterning the film by the photolithography method.

Thereafter, a Vizplex Imagin Film manufactured by E Ink was adhered to the pixel electrode as a display element 12, a counter electrode 13 and a counter substrate 14. Thus, the reflective electrophoresis image display unit of the example was obtained.

Comparative Example

Figure 6:
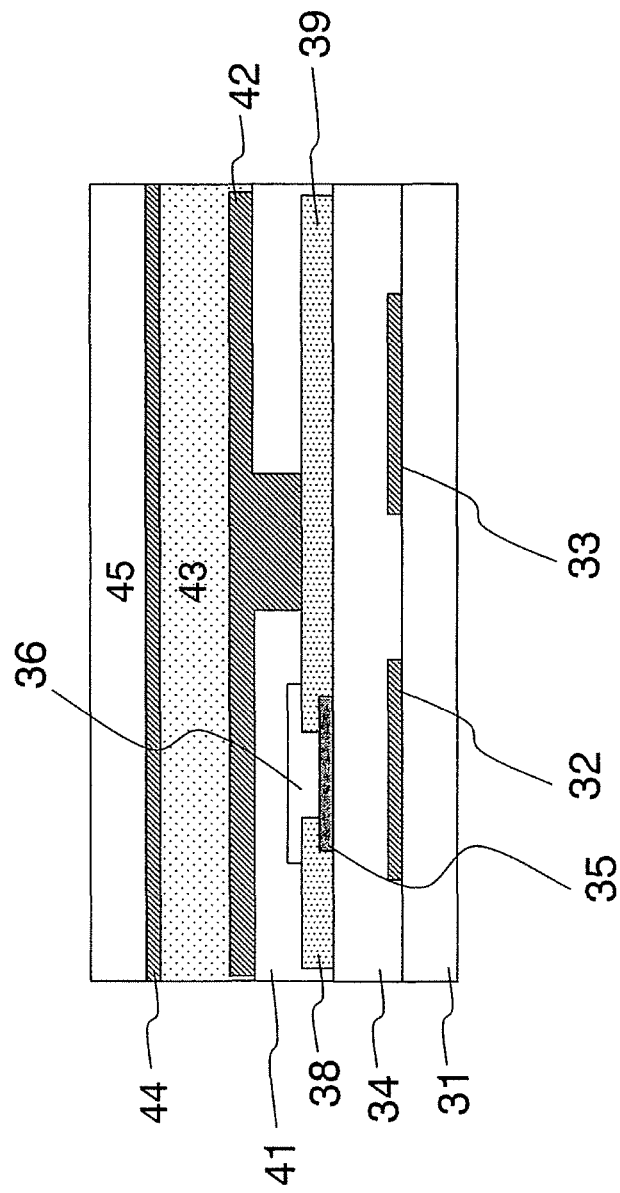
FIG. 6 is a schematic cross-sectional diagram showing approximately one pixel of an image display unit which has an existing structure of a comparative example (a related art) of the present invention.

The image display unit 40 shown in FIG. 6 was manufactured as a comparative example.
Alkali-free glass 1737 manufactured by Corning was used as a substrate 11. A film of ITO was formed so as to have a thickness of 100 nm on the substrate 1 by a DC magnetron sputtering method. Thus, a gate electrode 32 and a capacitor electrode 33 were formed by patterning the film in the predetermined shape by the photolithography method.

Next, a gate insulating film 34 was formed by forming a film of silicon oxynitride (SiON) with a thickness of 300 nm by a RF magnetron sputtering method on the entire surface of the substrate on which the gate electrode 32 and the capacitor electrode 33 were formed.

Next, a film of indium gallium zinc oxide (In—Ga—Zn—O) was formed so as to have a thickness of 40 nm on the gate insulating film 34 by a RF magnetron sputtering method. Then, a semiconductor layer 35 was formed by patterning the film using the photolithography method.

A negative type photo-resist was applied to the substrate 11 on which the semiconductor layer 35 was formed and the resist was exposed and developed. Then, a resist pattern having a predetermined shape was formed and a film of ITO with a thickness of 100 nm was formed by a DC magnetron sputtering method. Thereafter, the source electrode 38 and the drain electrode 39 were formed by perfuming a liftoff for unnecessary parts of the photoresist and the ITO.

Next, a SiON film with a thickness of 100 nm was formed by a RF magnetron sputtering method. Then, a protective film 36 was formed by patterning the SiOn film by the photolithography method and an active ion etching method.

Next, a film of a photosensitive acrylic resin with a thickness of 3 μm was applied and exposed. Then, an inter-layer insulating film 41 was formed by developing and burning the film.

A film of ITO with a thickness of 100 nm was formed thereon by a DC magnetron sputtering method. Then, a pixel electrode 42 was formed by patterning the film by the photolithography method.

Thereafter, a Vizplex Imagin Film manufactured by E Ink was adhered as a display element 43, a common electrode 44 and a front substrate, 45. Thus, the reflective electrophoresis image display unit of the comparative example was obtained.

Figure 7:
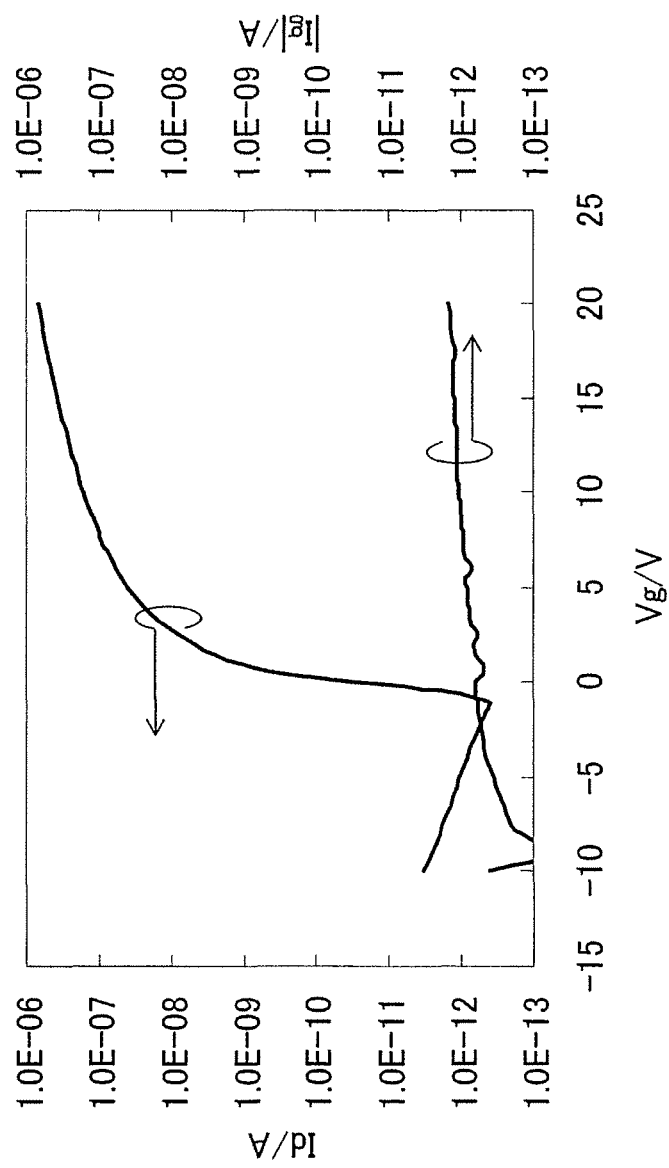
FIG. 7 is a view showing electrical current-electrical voltage properties and a gate electrical current of a thin film transistor of an embodiment of the present invention.
Figure 8:
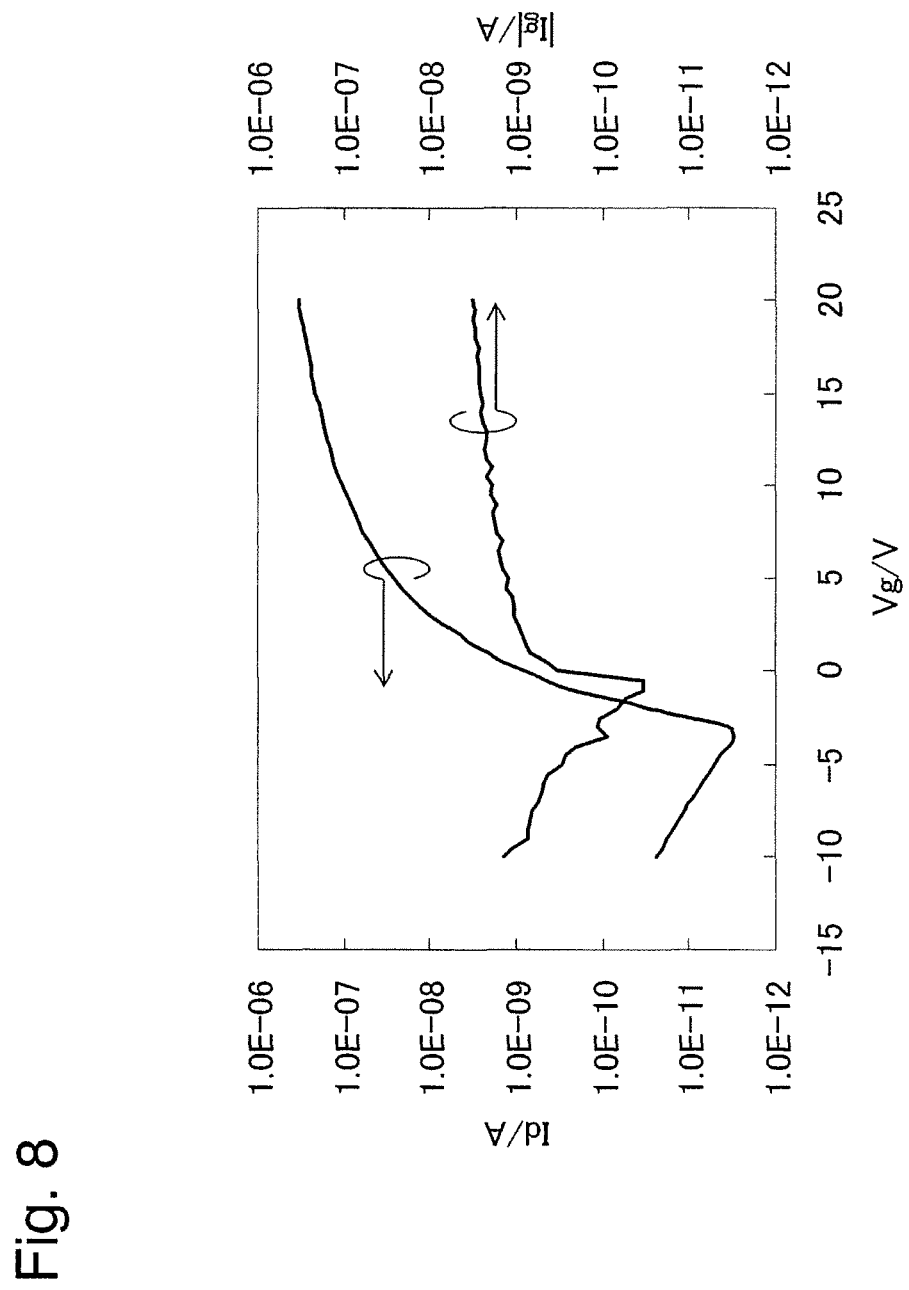
FIG. 8 is a view showing electrical current-electrical voltage properties and a gate electrical current of a thin film transistor of a comparative example of the present invention.

FIG. 7 is a view showing a transfer property (Id/A) and a gate electrical current (|Ig|/A) of the thin film transistor of the example of the present invention. FIG. 8 is a view showing a transfer property (Id/A) and a gate electrical current (|Ig|/A) of the thin film transistor of the comparative example of the present invention. A magnitude of the gate electrical current shows a magnitude of a leak current of the gate electrode. The properties of the thin film transistors of the image display units of the example and the comparative example are compared. It could be seen that the gate electrical current (the leak current) indicated by a right arrow was decreased and excellent properties was be obtained in the thin film transistor of the image display unit of the example. In addition, excellent image could be displayed in the image display unit of the present invention.

What is claimed is:

1. A thin film transistor comprising:
a substrate;
a gate electrode formed on the substrate;
a gate insulating film;
a semiconductor layer formed on the gate insulating film;
a protective film formed on the semiconductor layer and on the gate insulating film and having a first opening section and a second opening section which are separately and directly formed on the semiconductor layer;
a source electrode formed on the protective film and electrically connected to the semiconductor layer at the first opening section of the protective film;
a drain electrode formed on the protective film and electrically connected to the semiconductor layer at the second opening section of the protective film; and
a capacitor electrode separately formed from the gate electrode on the substrate and a third opening section of the protective film formed on the capacitor electrode.

2. The thin film transistor according to claim 1, wherein the protective film includes a layer having an inorganic material and a layer having an organic material formed on the layer having the inorganic material.

3. The thin film transistor according to claim 1, wherein the semiconductor layer has a non-single crystal silicon.

4. The thin film transistor according to claim 1, wherein the semiconductor layer has an organic compound.

5. The thin film transistor according to claim 1, wherein the semiconductor layer has a metal oxide.

6. The thin film transistor according to claim 5, wherein a layer of the protective film which is in touch with the semiconductor layer has a metal oxide insulating material.

7. An image display unit comprising:
a substrate;
a gate electrode formed on the substrate;
a gate insulating film;
a semiconductor layer formed on the gate insulating film;
a protective film formed on the semiconductor layer and on the gate insulating film and having a first opening section and a second opening section which are separately and directly formed on the semiconductor layer;
a source electrode formed on the protective film and electrically connected to the semiconductor layer at the first opening section of the protective film;
a drain electrode formed on the protective film and electrically connected to the semiconductor layer at the second opening section of the protective film;
an inter-layer insulating film formed on the source electrode and the drain electrode;
a pixel electrode formed on the inter-layer insulating film and electrically connected to the drain electrode;
a display element formed on the pixel electrode;
a counter electrode; and a capacitor electrode separately formed from the gate electrode on the substrate and a third opening section of the protective film formed on the capacitor electrode.

8. The image display unit according to claim 7, wherein the protective film includes a layer having an inorganic material and a layer having an organic material formed on the layer having the inorganic material.

9. The image display unit according to claim 7, wherein the semiconductor layer has a non-single crystal silicon.

10. The image display unit according to claim 7, wherein the semiconductor layer has an organic compound.

11. The image display unit according to claim 7, wherein the semiconductor layer has a metal oxide.

12. The image display unit according to claim 11, wherein a layer of the protective film which is touch with the semiconductor layer has a metal oxide insulating material.

13. The image display unit according to claim 7, wherein the display element is any one of an electrophoresis display medium, a liquid crystal display medium, an organic electroluminescence or an inorganic electroluminescence.

* * * * *